(12) United States Patent
Iino et al.

(10) Patent No.: US 8,530,955 B2
(45) Date of Patent: Sep. 10, 2013

(54) NONVOLATILE SEMICONDUCTOR MEMORY DEVICE AND METHOD FOR MANUFACTURING SAME

(75) Inventors: Hiromitsu Iino, Mie-ken (JP); Ryota Katsumata, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/236,744

(22) Filed: Sep. 20, 2011

(65) Prior Publication Data

US 2012/0241843 A1    Sep. 27, 2012

(30) Foreign Application Priority Data

Mar. 25, 2011    (JP) .................... 2011-067636

(51) Int. Cl.
*H01L 29/792* (2006.01)
(52) U.S. Cl.
USPC ............ 257/324; 257/E21.423; 257/E27.06; 257/758; 257/759; 257/760; 257/734; 438/586; 438/622; 438/624; 438/778
(58) Field of Classification Search
USPC ............ 257/324, 758–760, E21.423, E27.06, 257/734; 438/586, 622, 624, 778
See application file for complete search history.

(56) References Cited

U.S. PATENT DOCUMENTS

| | | | |
|---|---|---|---|
| 2004/0256731 A1* | 12/2004 | Mao et al. | 257/773 |
| 2005/0236177 A1* | 10/2005 | Inagaki et al. | 174/255 |
| 2006/0186446 A1* | 8/2006 | Kim et al. | 257/296 |
| 2006/0292858 A1* | 12/2006 | Bhattacharyya et al. | 438/622 |
| 2008/0099819 A1* | 5/2008 | Kito et al. | 257/315 |
| 2008/0173932 A1* | 7/2008 | Kidoh et al. | 257/324 |
| 2009/0242967 A1* | 10/2009 | Katsumata et al. | 257/324 |
| 2010/0207190 A1 | 8/2010 | Katsumata et al. | |
| 2010/0207195 A1* | 8/2010 | Fukuzumi et al. | 257/326 |
| 2011/0031550 A1* | 2/2011 | Komori et al. | 257/324 |

FOREIGN PATENT DOCUMENTS

JP    2010-192531    9/2010

* cited by examiner

*Primary Examiner* — Asok K Sarkar
*Assistant Examiner* — Dmitriy Yemelyanov
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array part, a first contact part, and a peripheral circuit part. The first contact part is juxtaposed with the memory cell array part in a first plane. The peripheral circuit part is juxtaposed with the memory cell array part in the first plane. The memory cell array part includes a first stacked body, a first semiconductor layer, and a memory film. The first contact part includes a first contact part insulating layer, and a plurality of first contact electrodes. The peripheral circuit part includes a peripheral circuit, a structure body, a peripheral circuit part insulating layer, and a peripheral circuit part contact electrode. A width along an axis perpendicular to the first axis of the peripheral circuit part insulating layer is smaller than a diameter of the first particle.

15 Claims, 9 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-067636, filed on Mar. 25, 2011; the entire contents of which are incorporated herein by reference.

FIELD

Embodiments described herein relate generally to a nonvolatile semiconductor memory device and a method for manufacturing the same.

BACKGROUND

There has been proposed a three-dimensional stacked memory in order to increase a memory capacity of a nonvolatile semiconductor memory device. In the three-dimensional stacked memory, for example, a stacked body which has alternately stacked insulating films and electrode films, a silicon pillar that penetrates the stacked body in a stacked direction, and a charge storage layer (a memory layer) between the silicon pillar and the electrode film are provided. Thereby, memory cells are provided at intersecting portions of the silicon pillar and the each electrode film. Further, a configuration using a U-shaped memory string, which is formed by connecting two silicon pillars at a substrate side, can also be considered.

Since the memory cells are stacked highly in the three-dimensional stacked memory, a contact electrode of the memory cell is long. Hence, a thickness of an insulating film buried in a contact part is thick. In order to achieve stable performance and high productivity, in the contact part, a configuration of the contact part with a high burying property is desired while warpage of a wafer due to a film stress, etc. is suppressed.

DETAILED DESCRIPTION

Figure 1:
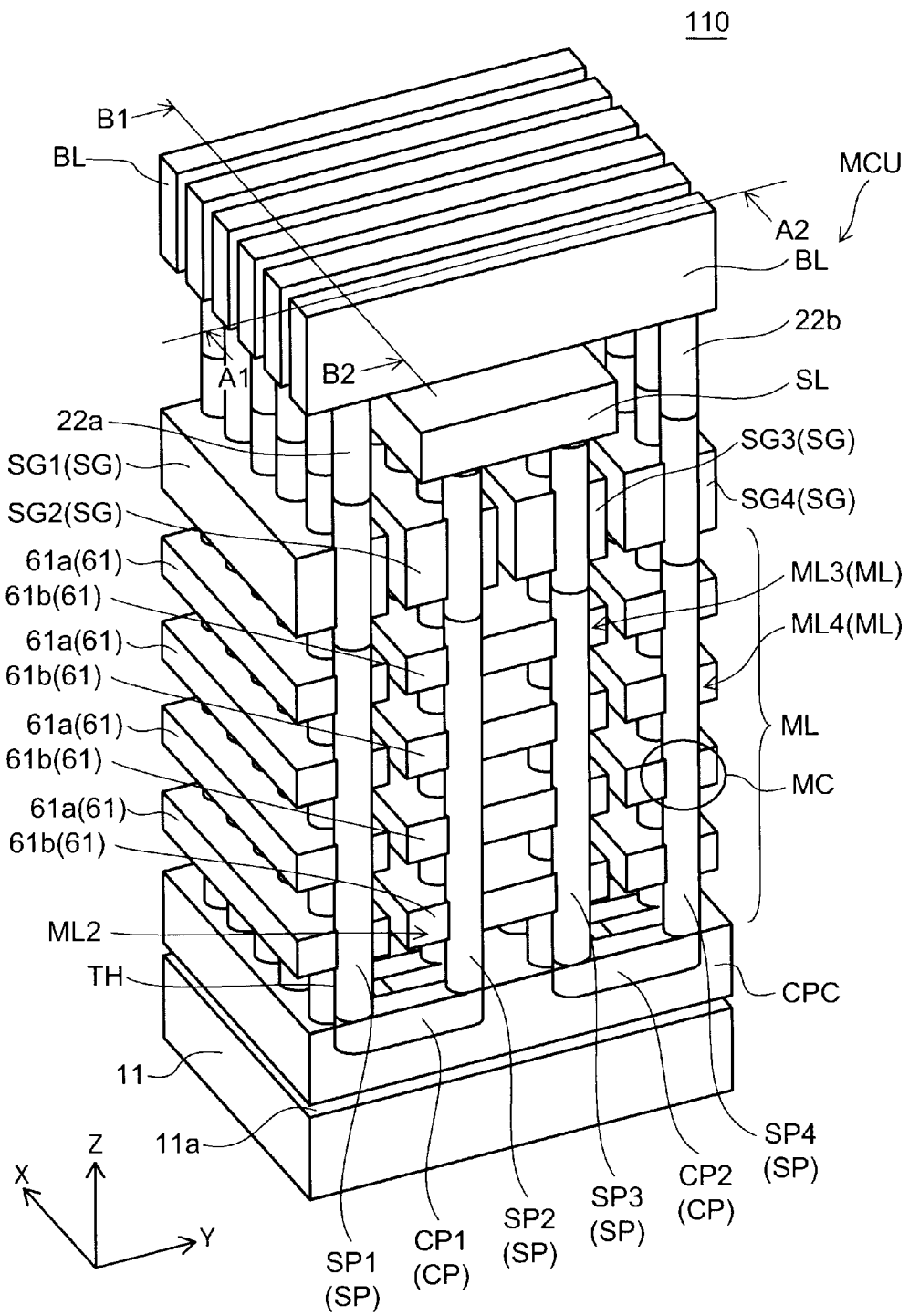
FIG. 1 is a schematic perspective view illustrating the configuration of a nonvolatile semiconductor memory device according to an embodiment.

According to one embodiment, a nonvolatile semiconductor memory device includes a memory cell array part, a first contact part, and a peripheral circuit part. The first contact part is juxtaposed with the memory cell array part in a first plane. The peripheral circuit part is juxtaposed with the memory cell array part in the first plane. The memory cell array part includes a first stacked body, a first semiconductor layer, and a memory film. The first stacked body includes a plurality of first electrode films stacked along a first axis perpendicular to the first plane, and a first inter-electrode insulating film provided between the two first electrode films being adjacent along the first axis. The first semiconductor layer is opposed to side faces of the plurality of first electrode films. The memory film is provided between the plurality of first electrode films and the first semiconductor layer. The first contact part includes a first contact part insulating layer, and a plurality of first contact electrodes. The first contact part insulating layer includes a first contact part insulating film and a first particle dispersed in the first contact part insulating film. The plurality of first contact electrodes penetrate the first contact part insulating layer along the first axis. Each of the plurality of first contact electrodes is connected to each of the plurality of first electrode films. The peripheral circuit part includes a peripheral circuit, a structure body, a peripheral circuit part insulating layer, and a peripheral circuit part contact electrode. The structure body is stacked along the peripheral circuit and the first axis. The peripheral circuit part insulating layer is buried in the structure body and extends along the first axis. The peripheral circuit part contact electrode penetrates the peripheral circuit part insulating layer along the first axis, and is connected to the peripheral circuit. A width along an axis perpendicular to the first axis of the peripheral circuit part insulating layer is smaller than a diameter of the first particle.

According to one embodiment, a method is disclosed for manufacturing a nonvolatile semiconductor memory device. The device includes a memory cell array part, a first contact part juxtaposed with the memory cell array part in a first plane, and a second contact part juxtaposed with the memory cell array part in the first plane. The memory cell array part includes a first stacked body including a plurality of first electrode films stacked along a first axis perpendicular to the plane, and a first inter-electrode insulating film provided between the two first electrode films adjacent to each other along the first axis, a first semiconductor layer opposed to side faces of the plurality of first electrode films, and a memory film provided between the plurality of first electrode films and the first semiconductor layer. The first contact part includes a first contact part insulating layer including a first contact part insulating film and a first particle dispersed in the first contact part insulating film, and a plurality of first contact electrodes penetrating the first contact part insulating layer along the first axis, each of the plurality of first contact electrodes being connected to each of the plurality of first electrode films. The peripheral circuit part includes a peripheral circuit, a structure body stacked along the peripheral circuit and the first axis, a peripheral circuit part insulating layer buried in the structure body and extending along the first axis, and a peripheral circuit part contact electrode penetrating the peripheral circuit part insulating layer along the first axis, and connected to the peripheral circuit. A width along an axis perpendicular to the first axis of the peripheral circuit part insulating layer is narrower than a width along an axis perpendicular to the first axis of the first contact part insulating layer. A content ratio of the first particle in the peripheral circuit part insulating layer is lower than a content ratio of the first particle included in the first contact part insulating layer. The method can include forming a first contact part concave portion for the first contact part insulating layer being buried in. The first contact part concave portion has a width narrower than a width perpendicular to a first axis of a peripheral circuit part concave portion for the peripheral circuit part insulating layer formed on a substrate being buried in. The method can include burying a same material as used for the first contact part insulating film in the peripheral circuit part concave portion while burying the first contact part insulating film and the first particle in the first contact part concave portion.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

Embodiment

FIG. 1 is a schematic perspective view illustrating the configuration of a nonvolatile semiconductor memory device according to an embodiment.

In FIG. 1, conductive portions are shown and insulating portions are omitted in order to make the drawing more visible. As shown in FIG. 1, a nonvolatile semiconductor memory device 110 according to the embodiment includes a memory cell array part MCU. A plurality of memory cells MC are provided in the memory cell array part MCU. An example of a configuration of the memory cell MC will be described later.

The memory cell array part MCU is, for example, provided on a major surface 11a of a substrate 11.

A semiconductor substrate, for example, is used for the substrate 11. A silicon substrate, for example, is used for the substrate 11.

Here, a Z-axis (a first axis) is set as an axis perpendicular to the major surface 11a of the substrate 11. A Y-axis (a second axis) is set as one axis perpendicular to the Z-axis. An X-axis (a third axis) is set as an axis perpendicular to the Z-axis and the Y-axis.

The memory cell array part MCU includes a stacked body ML, a semiconductor layer SP, and a memory film that is not shown.

The stacked body ML includes a plurality of electrode films 61 stacked along the Z-axis, and inter-electrode insulating films (not shown in FIG. 1) provided among the plurality of electrode films 61.

In the specification of the application, "stack" also includes a case where components are stacked with another component inserted between the components other than a case where the components are stacked in contact with each other.

The semiconductor layer SP is opposed to side faces of the plurality of electrode films 61. The side face of the electrode film 61 is a face substantially along the Z-axis among faces of the electrode film 61.

In this example, the semiconductor layer SP is a semiconductor pillar that penetrates the stacked body ML along the Z-axis. That is, the semiconductor layer SP penetrates the electrode film 61 along the Z-axis. As will be described later, the memory film is provided between the plurality of electrode films 61 and the semiconductor layer SP.

The memory cells MC (memory cell transistors) are formed at intersecting portions of the plurality of electrode films 61 and the semiconductor layer SP.

Specifically, the plurality of stacked bodies ML include, for example, first to fourth stacked bodies ML1 to ML4, etc. The plurality of stacked bodies ML have, for example, portions extending along the X-axis. The plurality of stacked bodies ML are, for example, aligned along the Y-axis. Each of the plurality of stacked bodies ML includes the plurality of electrode films 61 stacked along the Z-axis, and the inter-electrode insulating film (not shown in this drawing) provided between the two electrode films 61 adjacent to each other along the Z-axis.

The first stacked body ML1 includes a plurality of first electrode films 61a. The second stacked body ML2 includes a plurality of second electrode films 61b. In this example, the plurality of electrode films 61 included in the third stacked body ML3 are continuous to each of the plurality of second electrode films 61b. Although the second stacked body ML2 and the third stacked body ML3 are continuous to each other, each of them is referred to as the second stacked body ML2 and the third stacked body ML3 for convenience. Further, as will be described later, the plurality of electrode films 61 included in the fourth stacked body ML4 are electrically connected to the plurality of first electrode films 61a in this example.

The plurality of electrode films 61 have portions extending along the X-axis.

Although a case is depicted in FIG. 1 where the number of the electrode films 61 is four in order to make the drawing more visible, the number of the electrode films 61 is arbitrary in the embodiment.

For example, the plurality of semiconductor layers SP are set as first to fourth semiconductor layers SP1 to SP4. Each of the first to fourth semiconductor layers SP1 to SP4 penetrates each of the first to fourth stacked bodies ML1 to ML4.

The first to fourth semiconductor layers SP1 to SP4 are, for example, aligned along the Y-axis. The second semiconductor layer SP2 is disposed between the first semiconductor layer SP1 and the fourth semiconductor layer SP4. The third semiconductor layer SP3 is disposed between the second semiconductor layer SP2 and the fourth semiconductor layer SP4.

One end of the first semiconductor layer SP1 and one end of the second semiconductor layer SP2 are electrically connected to each other by a first connection part CP1 (a connection part CP). One end of the third semiconductor layer SP3 and one end of the fourth semiconductor layer SP4 are electrically connected to each other by a second connection part CP2. The above-described "one end" is an end of a substrate 11 side.

The other end of the first semiconductor layer SP1 is connected to a bit line BL by a contact via 22a. The other end of the fourth semiconductor layer SP4 is connected to the bit line BL by a contact via 22b. The other end of the second semiconductor layer SP2 and the other end of the third semiconductor layer SP3 are connected to a source line SL.

First to fourth select gate electrodes SG1 to SG4 are provided between the first stacked body ML1 and the bit line BL, between the second stacked body ML2 and the source line SL, between the third stacked body ML3 and the source line SL, and between the fourth stacked body ML4 and the bit line BL, respectively. The first to fourth select gate electrodes SG1 to SG4 are any of the plurality of select gate electrodes SG. The first to fourth select gate electrodes SG1 to SG4 extend along the X-axis.

For example, a through hole TH extending along the Z-axis is provided on the plurality of stacked bodies ML. The semiconductor layer SP is formed by burying a semiconductor material inside the through hole TH.

The plurality of semiconductor layers SP aligned along the X-axis can be provided for the one electrode film 61. The plurality of semiconductor layers SP are provided in a matrix form along the X-axis and the Y-axis. The memory cell MC is formed at each of the intersecting portions of the plurality of electrode films 61 stacked along the Z-axis and the plurality of semiconductor layers SP. The memory cells MC are provided in a three-dimensional matrix form along the Z-axis, the X-axis, and the Y-axis.

A semiconductor material used for the semiconductor layer SP, for example, is used for the connection part CP.

The memory cell array part MCU can further include a connection part conductive layer CPC opposed to the connection part CP. For example, a trench is provided in the connection part conductive layer CPC, and the connection part CP is formed by burying the semiconductor material inside the trench. The two semiconductor layers SP connected to each of the connection parts CP are electrically connected to each other by controlling a potential of the connection part conductive layer CPC.

The first semiconductor layer SP1 and the second semiconductor layer SP2 connected to each other serve as a memory string. The third semiconductor layer SP3 and the fourth semiconductor layer SP4 connected to each other serve as another memory string.

Figure 2:
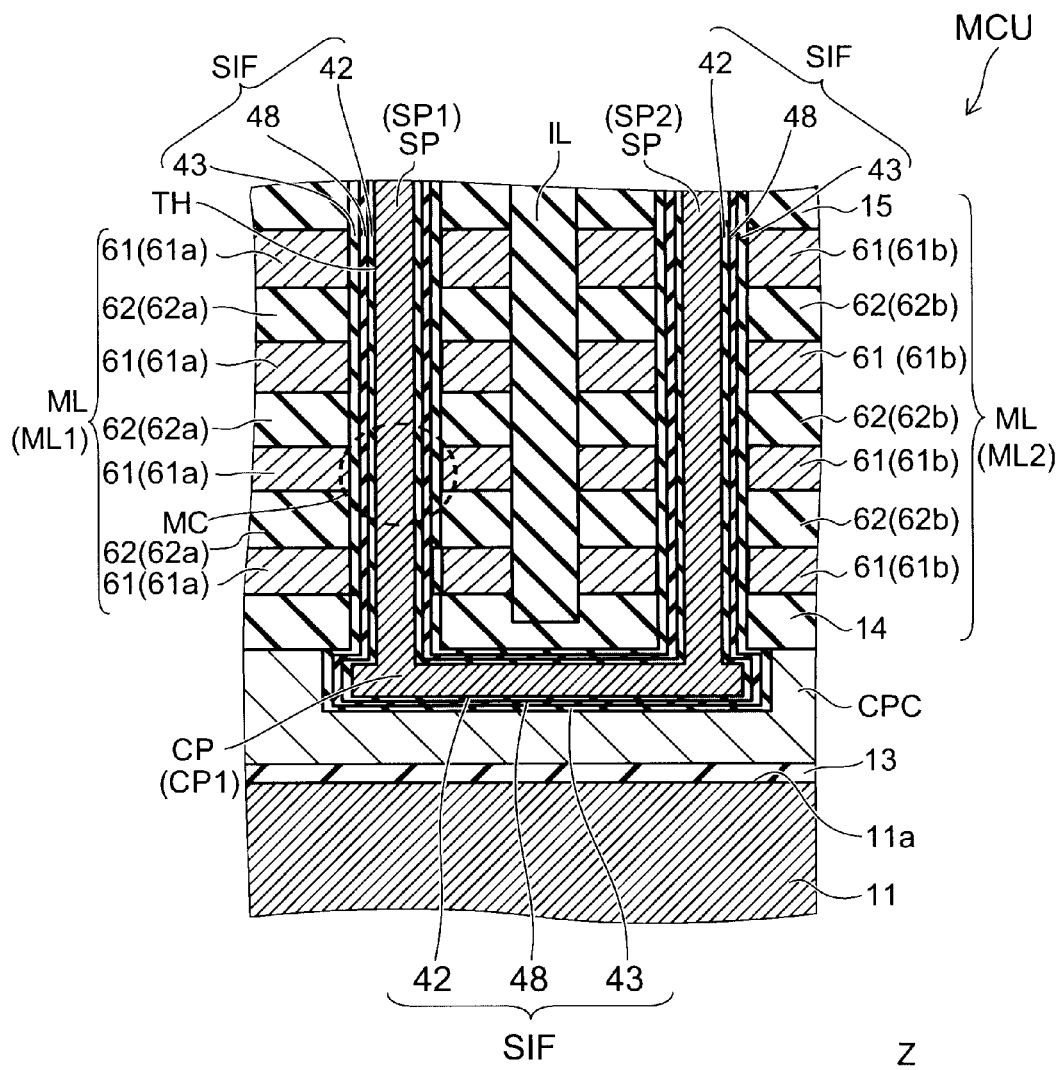
FIG. 2 is a schematic cross-sectional view illustrating the configuration of the nonvolatile semiconductor memory device according to the embodiment.

FIG. 2 is a schematic cross-sectional view illustrating the configuration of the nonvolatile semiconductor memory device according to the embodiment.

FIG. 2 illustrates a part of a cross section taken along a line A1-A2 of FIG. 1.

As shown in FIG. 2, the first stacked body ML1 includes the plurality of first electrode films 61a stacked along the Z-axis, and a first inter-electrode insulating film 62a provided between the two first electrode films 61a adjacent to each other along the Z-axis.

The first semiconductor layer SP1 penetrates the plurality of first electrode films 61a. That is, the first semiconductor layer SP1 is opposed to side faces of the plurality of first electrode films 61a, and extends along the Z-axis.

The second stacked body ML2 is, for example, juxtaposed with the first stacked body ML1 along the Y-axis. The second stacked body ML2 includes the plurality of second electrode films 61b stacked along the Z-axis, and a second inter-electrode insulating film 62b provided between the two second electrode films 61b adjacent to each other along the Z-axis.

The second semiconductor layer SP2 penetrates the plurality of second electrode films 61b. That is, the second semiconductor layer SP2 is opposed to side faces of the plurality of second electrode films 61b, and extends along the Z-axis.

A memory film SIF is provided between the plurality of first electrode films 61a and the first semiconductor layer SP1. The memory film SIF extends between the plurality of second electrode films 61b and the second semiconductor layer SP2. The memory film SIF is provided around a side face along the Z-axis of the semiconductor layer SP. The memory film SIF extends between the connection part CP (for example, the first connection part CP1) and the connection part conductive layer CPC.

For example, the memory film SIF includes a charge holding film 48, an inner insulating film 42, and an outer insulating film 43. The charge holding film 48 is provided between the electrode film 61 and the semiconductor layer SP, and between the connection part conductive layer CPC and the connection part CP. The inner insulating film 42 is provided between the semiconductor layer SP and the charge holding film 48, and between the connection part CP and the charge holding film 48. The outer insulating film 43 is provided between the charge holding film 48 and the electrode film 61, and between the charge holding film 48 and the connection part conductive layer CPC.

As shown in FIG. 2, a separating insulating layer IL that separates the first stacked body ML1 from the second stacked body ML2 is provided. The separating insulating layer IL separates the plurality of first electrode films 61a from the plurality of second electrode films 61b. The separating insulating layer IL includes a portion extending along the X-axis.

As illustrated in FIG. 2, an insulating film 13 is provided between the substrate 11 and the connection part conductive layer CPC in this example. An interlayer insulating film 14 is provided between the plurality of electrode films 61 and the connection part conductive layer CPC. Further, an interlayer insulating film 15 is provided. The plurality of electrode films 61 are disposed between the interlayer insulating film 14 and the interlayer insulating film 15. For convenience, the interlayer insulating films 14 and 15 shall also be included in the stacked body ML.

Polysilicon, for example, is used for the electrode film 61 and the connection part conductive layer CPC. However, in the embodiment, a material used for the electrode film 61 and the connection part conductive layer CPC is arbitrary.

Silicon oxide, for example, is used for the inter-electrode insulating film 62, the inner insulating film 42, the outer insulating film 43, and the insulating film 13, the interlayer insulating film 14, and the interlayer insulating film 15. However, in the embodiment, a material used for the inter-electrode insulating film 62, the inner insulating film 42, the outer insulating film 43, and the interlayer insulating films is arbitrary.

Silicon nitride, for example, is used for the charge holding film 48. However, in the embodiment, a material used for the charge holding film 48 is arbitrary.

In the memory cell MC, the charge holding film 48 can store a charge, and can function as a portion that stores information. The inner insulating film 42 can, for example, function as a tunnel insulating film. The outer insulating film 43 can function as a block insulating film. The memory cell MC is, for example, a transistor having a MONOS configuration. The plurality of electrode films 61 can function as a word electrode.

Figure 3:
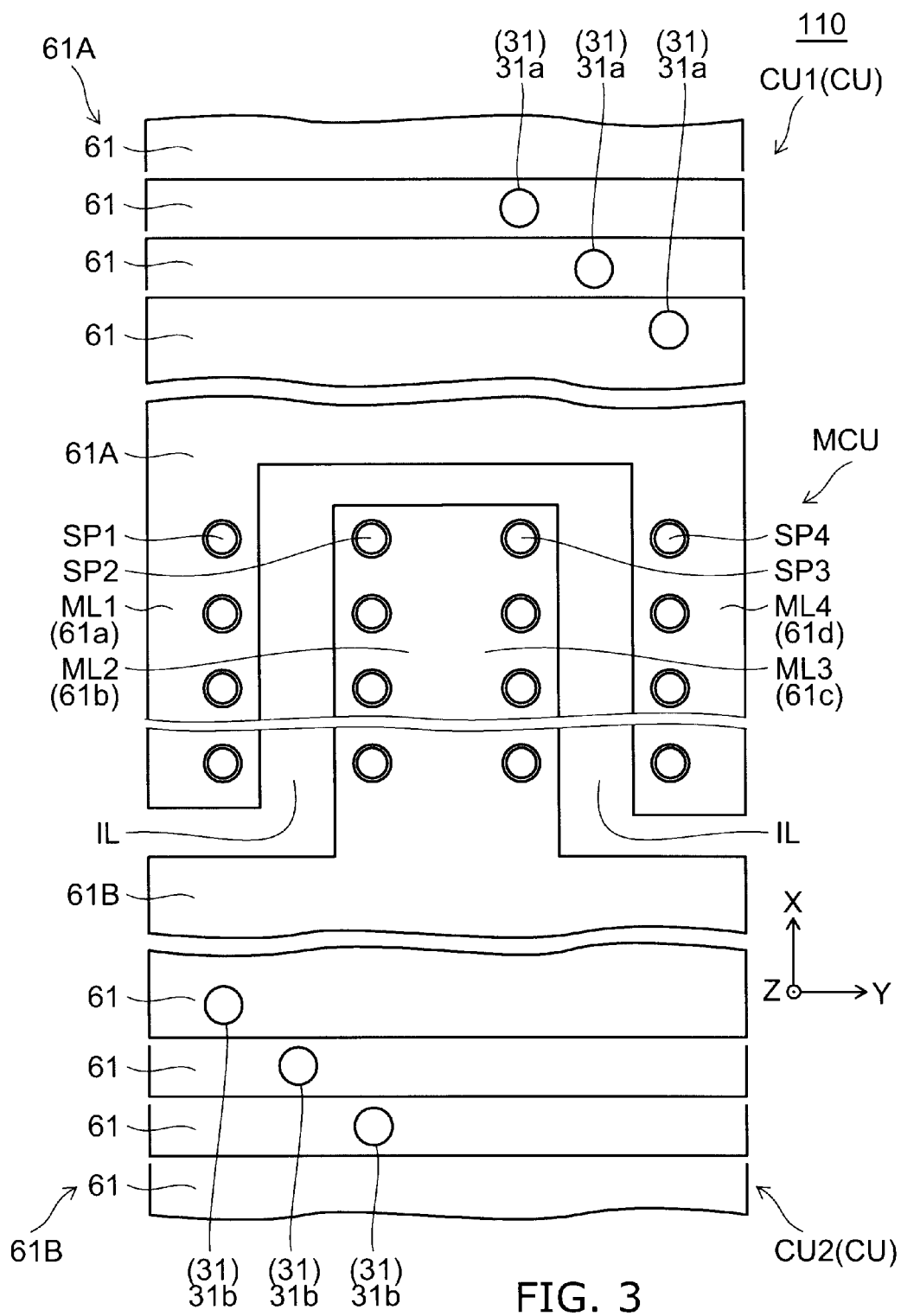
FIG. 3 is a schematic plan view illustrating the configuration of the nonvolatile semiconductor memory device according to the embodiment.

FIG. 3 is a schematic plan view illustrating the configuration of the nonvolatile semiconductor memory device according to the embodiment.

Although the four semiconductor layers SP aligned along the X-axis are depicted for the one electrode film 61 in order to make the drawing more visible in FIG. 3, the number of the semiconductor layers SP aligned along the X-axis is arbitrary in the embodiment.

As shown in FIG. 3, for example, the first electrode film 61a of the first stacked body ML1 penetrated by the first semiconductor layer SP1, and a fourth electrode film 61d of the fourth stacked body ML4 penetrated by the fourth semiconductor layer SP4 are connected at one end (for example, the first contact part CU1) of the X-axis. The first electrode film 61a and the fourth electrode film 61d connected to each other serve as a first coupled electrode film 61A.

As shown in FIG. 3, lengths along an X-axis direction of the first coupled electrode film 61A change stepwise in the plurality of electrode films 61 stacked along the Z-axis.

As previously described, the second electrode film 61b of the second stacked body ML2 penetrated by the second semiconductor layer SP2, and a third electrode film 61c of the third stacked body ML3 penetrated by the third semiconductor layer SP3 are connected. However, the second electrode film 61b and the third electrode film 61c may be connected at the other end (a second contact part CU2) of the X-axis. The second electrode film 61b and the third electrode film 61c connected to each other serve as a second coupled electrode film 61B.

As shown in FIG. 3, lengths along the X-axis change stepwise in the plurality of electrode films 61 stacked along the Z-axis. That is, a length along the X-axis of the electrode film 61 near the substrate 11 is longer than a length along the X-axis of the electrode film 61 far from the substrate 11. This structure is shown in the following FIG. 4.

Figure 4:
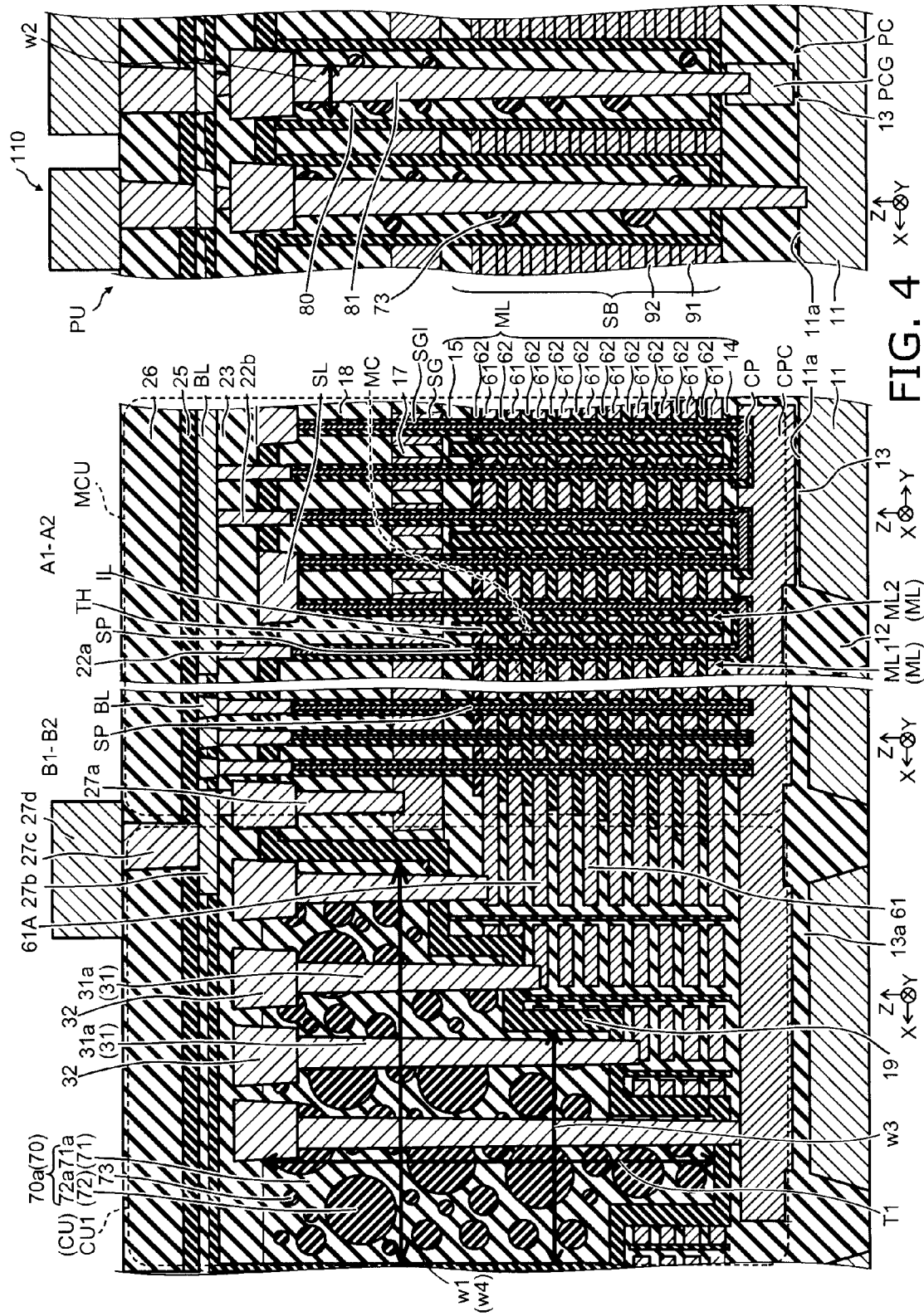
FIG. 4 is a schematic cross-sectional view illustrating the configuration of the nonvolatile semiconductor memory device according to the embodiment.

FIG. 4 is a schematic cross-sectional view illustrating the configuration of the nonvolatile semiconductor memory device according to the embodiment.

FIG. 4, as for the memory cell array part MCU, illustrates a cross section corresponding to the line A1-A2 of FIG. 1, and a cross section corresponding to a line B1-B2 of FIG. 1. In addition, the first contact part CU1 is illustrated in FIG. 4.

Although a case is depicted in FIG. 4 where the number of the electrode films 61 is ten, the number of the electrode films 61 is arbitrary in the embodiment.

As illustrated in FIG. 4, the memory cell array part MCU and the contact part CU (for example, the first contact part CU1, etc.) are provided. The contact part CU is juxtaposed with the memory cell array part MCU in a first plane (for example, a plane parallel to the major surface 11a, i.e., an X-Y plane).

As shown in FIG. 4, in the memory cell array part MCU, a device isolation insulating layer 12 is provided in the major surface 11a of the substrate 11, the insulating film 13 is provided on the major surface 11a, the connection part conductive layer CPC is provided on the insulating film 13, the stacked body ML is provided on the connection part conductive layer CPC, and the plurality of select gate electrodes SG are provided on the stacked body ML. An interlayer insulating film 17 is provided among the plurality of select gate electrodes SG.

A select gate insulating film SGI is provided between the select gate electrode SG and the semiconductor layer SP. Select gate transistors are formed at the intersecting portions of the plurality of select gate electrodes SG and the plurality of semiconductor layers SP. The select gate electrode SG is connected to an upper conductive layer (a conductive layer, which is the same layer as the bit line BL, in this example) by a contact interconnect 27a.

A portion which penetrates the stacked body ML and a portion which penetrates the select gate electrode SG in the semiconductor layer SP may be collectively formed, or may be formed in different processes.

An interlayer insulating film 18 is provided between the source line SL and the select gate electrode SG. An interlayer insulating film 23 is provided between the source line SL and the bit line BL. A liner film 19 is provided between the interlayer insulating film 18 and the interlayer insulating film 23. The liner film 19 functions, for example, as a contact etch stopper.

The source line SL has been buried in a part of the liner film 19. The contact vias 22a and 22b penetrate the liner film 19 and the interlayer insulating film 23 along the Z-axis.

An interlayer insulating film 25 is provided on the bit line BL. An interlayer insulating film 26 is provided on the interlayer insulating film 25.

Polysilicon, for example, is used for the select gate electrode SG. Silicon oxide, for example, is used for the select gate insulating film SGI. In addition, a material constitutes at least a part of the inner insulating film 42, the charge holding film 48, and the outer insulating film 43 may be used for the select gate insulating film SGI.

Silicon oxide, for example, can be used for the interlayer insulating film 17, the interlayer insulating film 18, the interlayer insulating film 23, and the interlayer insulating film 26. Silicon nitride, for example, can be used for the liner film 19 and the interlayer insulating film 25.

A metal material etc., for example, are used for the source line SL, the bit line BL, and the contact vias 22a and 22b. However, an arbitrary conductive material can be used for the source line SL, the bit line BL, and the contact vias 22a and 22b.

An interconnect layer 27b is provided in the first contact part CU1. The interconnect layer 27b is, for example, the same layer as the bit line BL. The interconnect layer 27b is connected to the contact interconnect 27a. Further, a select gate interconnect 27d is provided. The select gate interconnect 27d is connected to the interconnect layer 27b through a contact interconnect layer 27c. Thereby, the select gate electrode SG is connected to the select gate interconnect 27d.

As previously described, in the first contact part CU1, the lengths along the X-axis of the stacked plurality of first electrode films 61a (the first coupled electrode film 61A) change stepwise. The liner film 19 which covers each of the plurality of electrode films 61 is provided in the first contact part Cu1.

Additionally, a first contact electrode 31a (a contact electrode 31) is connected to each of the plurality of first electrode films 61a (the first coupled electrode films 61A). The first contact electrode 31a (the contact electrode 31) extends along the Z-axis. The first contact electrode 31a penetrates the liner film 19 to be connected to each of the plurality of first electrode films 61a (the first coupled electrode films 61A).

The first contact electrode 31a (the contact electrode 31) connects each of the plurality of first electrode films 61a to each of a plurality of word lines 32. At least a part of the word lines 32 can be set to be the same layer as the source line SL.

The first contact electrode 31a is buried in a first contact part insulating layer 70a. In the embodiment, the first contact part insulating layer 70a contains a first particle 72a. A diameter of the first particle 72a is, for example, not less than 300 nm (nanometers).

As described above, in the embodiment, the contact part CU (the first contact part CU1) includes the contact part insulating layer 70 (the first contact part insulating layer 70a) and the plurality of contact electrodes 31 (the first contact electrodes 31a).

The contact part insulating layer 70 (the first contact part insulating layer 70a) includes a contact part insulating film 71 (a first contact part insulating film 71a) and contains a particle 72 (the first particle 72a) dispersed in the contact part insulating film 71. The diameter of the particle 72 is, for example, not less than 300 nm.

The plurality of contact electrodes 31 penetrate the contact part insulating layer 70 along the Z-axis. Each of the plurality of contact electrodes 31 is connected to each of the plurality of electrode films 61. The plurality of contact electrodes 31 extend along the Z-axis.

In the first contact part CU1, a thickness T1 (a thickness along the Z-axis) of a concave portion (for example, a groove) in which the contact part insulating layer 70 is buried is, for example, approximately 1.5 μm (micrometers) to 3 μm.

As described above, an insulating material is buried in the deep wide concave portion, and thus the contact part insulating layer 70 is formed.

In the embodiment, a deep (thick) and wide contact region is provided in the contact part CU (for example, the first contact part CU1) of the plurality of electrode films 61 that function as word lines. Additionally, the contact part insulating layer 70 containing the particle 72 is provided in this wide contact region.

Silica, for example, can be used for the particle 72. A film formed of a coating-type SOG (Spin On Glass) material, for example, can be used for the contact part insulating film 71.

Since the coating-type contact part insulating film 71 is used in the contact part CU having such configuration, a burying property of the contact part CU is high. Additionally, since the particle 72, such as silica, is dispersed in the contact part insulating film 71, thermal contraction is small. As a result of this, a film stress is suppressed, and warpage of the wafer (the substrate 11), etc. are reduced. As a result of this, stable performance and high productivity can be achieved.

The concave portion in which the contact part insulating layer 70 is buried is enlarged toward an opening.

As shown in FIG. 4, a width w4 of a portion far from the substrate 11 is larger than a width w3 of a portion near the substrate 11. Since the lengths (the lengths along the X-axis) of the plurality of electrode films 61 change stepwise, the concave portion is enlarged toward the opening. As described above, the contact part insulating layer 70 is formed by burying the contact part insulating film 71 containing the particle 72 in the concave portion enlarged toward the opening. As a result of this, a void etc. is not easily generated in the concave portion.

As described above, in the embodiment, a width along an axis perpendicular to the Z-axis of the contact part insulating layer 70 is enlarged with increasing distance from the substrate 11. That is, the contact part insulating layer 70 has a first portion and a second portion aligned along the Z-axis. The first portion is disposed between the second portion and the substrate 11. The width w3 perpendicular to the Z-axis of the first portion is smaller than the width w4 perpendicular to the Z-axis of the second portion. According to such configuration, the burying property of the concave portion of the contact part CU can be further improved. Additionally, thermal contraction is small, a film stress is suppressed, and warpage of the wafer (the substrate 11), etc. are reduced.

As illustrated in FIG. 4, the contact part insulating layer 70 may further contain a fine particle 73 with a diameter less than 300 nm other than the particle 72 with a diameter not less than 300 nm.

In addition, as shown in FIG. 4, the nonvolatile semiconductor memory device 110 can further include a peripheral circuit part PU. The peripheral circuit part PU is juxtaposed with the memory cell array part MCU in the first plane (the plane parallel to the major surface 11a).

The peripheral circuit part PU includes a peripheral circuit PC, a structure body SB, a peripheral circuit part insulating layer 80, and a peripheral circuit part contact electrode 81.

The structure body SB is stacked along the peripheral circuit PC and the Z-axis.

For example, the peripheral circuit PC is provided on the major surface 11a of the substrate 11. The structure body SB is provided on the peripheral circuit PC.

The peripheral circuit PC includes, for example, a transistor. This transistor includes the insulating film 13 provided on the major surface 11a of the substrate 11, and a peripheral circuit gate electrode PCG provided on the insulating film 13. The insulating film 13 functions as a gate insulating film of the transistor. Polysilicon, for example, is used for the peripheral circuit gate electrode PCG. The peripheral circuit PC controls, for example, the memory cell MC.

The peripheral circuit part insulating layer 80 is buried in the structure body SB, and extends along the Z-axis.

The peripheral circuit part contact electrode 81 penetrates the peripheral circuit part insulating layer 80 along the Z-axis. The peripheral circuit part contact electrode 81 is connected to the peripheral circuit PC. The peripheral circuit part contact electrode 81 is, for example, connected to the peripheral circuit gate electrode PCG of the transistor of the peripheral circuit PC. In addition, the peripheral circuit part contact electrode 81 is, for example, connected to a diffusion region of the transistor of the peripheral circuit PC.

A width w2 along an axis perpendicular to the Z-axis of the peripheral circuit part insulating layer 80 is narrower than a width w1 along the axis perpendicular to the Z-axis of the contact part insulating layer 70.

In the example shown in FIG. 4, although the width w2 along the axis perpendicular to the Z-axis of the peripheral circuit part insulating layer 80 is the width along the X-axis, and the width w1 along the axis perpendicular to the Z-axis of the contact part insulating layer 70 is the width along the X-axis, directions of the widths are arbitrary in the X-Y plane in the embodiment.

That is, the peripheral circuit part insulating layer 80 has the width w2 along an arbitrary axis perpendicular to the Z-axis, the contact part insulating layer 70 has the width w1 along an arbitrary axis perpendicular to the Z-axis, and the width w2 is narrower than the width w1.

Additionally, in the embodiment, a content ratio of the particle 72 (a particle with a diameter not less than 300 nm) in the peripheral circuit part insulating layer 80 is lower than a content ratio of the particle 72 (the particle having a diameter not less than 300 nm) contained in the contact part insulating layer 70.

For example, the peripheral circuit part insulating layer 80 does not contain the particle 72 having the diameter not less than 300 nm. Alternatively, in the case where the peripheral circuit part insulating layer 80 contains the particle 72 having a diameter not less than 300 nm, the content ratio of the particle 72 having a diameter not less than 300 nm contained in the peripheral circuit part insulating layer 80 is lower than the content ratio of the particle 72 having a diameter not less than 300 nm contained in the contact part insulating layer 70.

The peripheral circuit part insulating layer 80 can contain the fine particle 73 having a diameter less than 300 nm.

The peripheral circuit part insulating layer 80 can be formed at the same time of forming the contact part insulating layer 70. That is, the particle and the insulating film material (the particle 72 and the contact part insulating film 71) are buried in a concave portion serving as the peripheral circuit part insulating layer 80, and in a concave portion serving as the contact part insulating layer 70.

The width w2 along the axis perpendicular to the Z-axis of the peripheral circuit part insulating layer 80 is, for example, less than 400 nm. That is, the peripheral circuit part insulating layer 80 is, for example, buried in a concave portion with a width less than 400 nm. Hence, it is difficult for the particle 72 having a diameter not less than 300 nm to be buried in this concave portion. Accordingly, the content ratio of the particle 72 (the particle having a diameter not less than 300 nm) in the peripheral circuit part insulating layer 80 is lower than the content ratio of the particle 72 (the particle having a diameter not less than 300 nm) contained in the contact part insulating layer 70.

It is desirable that the width w2 along the axis perpendicular to the Z-axis of the peripheral circuit part insulating layer 80 is, for example, less than 300 nm. That is, the peripheral circuit part insulating layer 80 is, for example, buried in a concave portion with a width less than 300 nm. Hence, the particle 72 having a diameter not less than 300 nm is not buried in this concave portion. Accordingly, also at this time, the content ratio of the particle 72 (the particle having a diameter not less than 300 nm) in the peripheral circuit part insulating layer 80 is lower than the content ratio of the particle 72 (the particle having a diameter not less than 300 nm) contained in the contact part insulating layer 70.

As described above, it is desirable that the width w2 along the axis perpendicular to the Z-axis of the peripheral circuit part insulating layer 80 is smaller than a diameter of a particle contained in the contact part insulating layer 70. As a result of this, the particle can be suppressed from blocking the concave portion serving as the peripheral circuit part insulating layer 80 at the time of forming the peripheral circuit part insulating layer 80. As a result of this, the burying property is improved.

As described above, in the embodiment, the wide concave portion (the concave portion of the contact part CU) is buried with a material containing the particle 72 with a large diameter. Additionally, the narrow concave portion (the concave portion of the peripheral circuit part PU) is buried with a material not containing the particle 72 with the large diameter. As a result of this, both the wide concave portion and the narrow concave portion can be buried with a high burying property. That is, generation of a void is suppressed. Additionally, controllability of film thicknesses of the peripheral circuit part insulating layer 80 and the contact part insulating layer 70 is also high.

Here, in the embodiment, the diameter of the particle 72 is set to be not less than 300 nm. The diameter of the particle 72 is set to be smaller than a width of the contact part insulating layer 70.

A diameter of the particle 72 can be calculated, for example, based on an electron microscope photographic image of a cross section of the particle 72, etc.

In the embodiment, a configuration of the structure body SB is arbitrary. That is, the structure body SB can have an arbitrary configuration provided on the peripheral circuit PC in the peripheral circuit part PU. In the specific example, the structure body SB includes a plurality of first peripheral layers 91 and a plurality of second peripheral layers 92. Each of the plurality of first peripheral layers 91 is the same layer as each of the plurality of electrode films 61. Each of the plurality of second peripheral layers 92 is the same layer as each of the plurality of inter-electrode insulating films 62.

The stacked body ML of the memory cell array part MCU is, for example, formed as follows.

A first film and a second film are stacked alternately to form a stacked body on the interlayer insulating film 14 on the major surface 11a of the substrate 11. Subsequently, for example, the separating insulating layer IL is formed. The separating insulating layer IL serves as a support body for the first film and the second film. After the separating insulating layer IL is formed, one of the first film and the second film is removed. Subsequently, a third film is formed at a position where the removed film was located.

For example, amorphous silicon to which an impurity is doped, for example, is used for the first film. Non-doped amorphous silicon is used for the second film. Additionally, for example, after the separating insulating layer IL is formed, the second film is removed. Removal of the second film is performed with alkaline chemical treatment, etc., for example, through a concave portion (a groove, a hole, etc.) formed in the stacked body, etc. Subsequently, a silicon oxide film is buried as the third film in a position where the second film existed. That is, the second film is replaced with the third film. The first film serves as the electrode film 61, and the third film serves as the inter-electrode insulating film 62.

The electrode film 61 extending to a part of the contact part CU is also, for example, formed as described above.

Meanwhile, for example, the above-described replacement of the second film with the third film is not performed in the peripheral circuit part PU. For example, the first peripheral layer 91 is the first film, and the second peripheral layer 92 is the second film.

Figure 5:
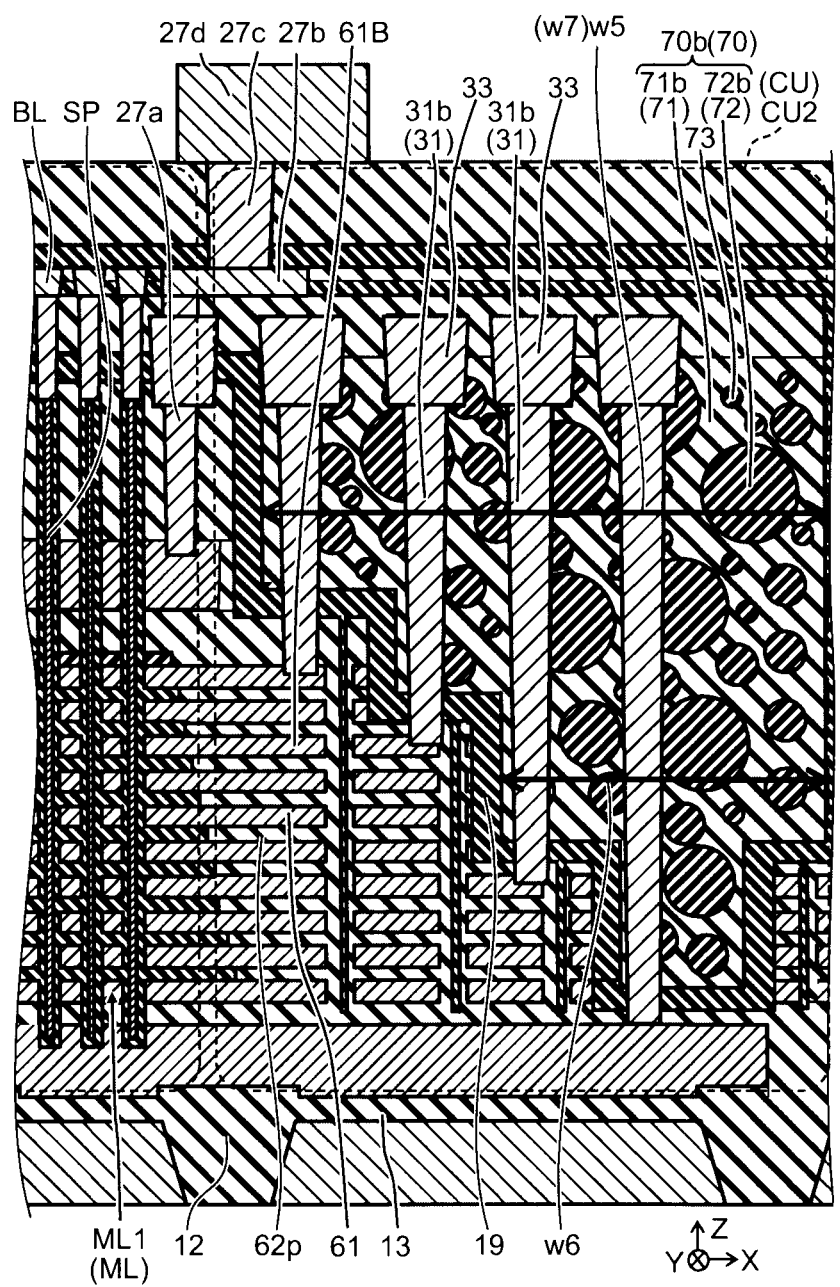
FIG. 5 is a schematic cross-sectional view illustrating the configuration of the nonvolatile semiconductor memory device according to the embodiment.

FIG. 5 is a schematic cross-sectional view illustrating the configuration of the nonvolatile semiconductor memory device according to the embodiment.

That is, FIG. 5 illustrates a cross section of the second contact part CU2 portion of the nonvolatile semiconductor memory device 110 according to the embodiment. The cross section of the second contact part CU2 in FIG. 5 is the cross section corresponding to an extension of the line B1-B2 of FIG. 1.

As shown in FIG. 5, the second contact part CU2 includes a second contact part insulating layer 70b and a plurality of second contact electrodes 31b.

The second contact part insulating layer 70b includes a second contact part insulating film 71b and contains a second particle 72b dispersed in the second contact part insulating film 71b. A diameter of the second particle 72b is, for example, not less than 300 nm.

The plurality of second contact electrodes 31b penetrate the second contact part insulating layer 70b along the Z-axis. Each of the plurality of second contact electrodes 31b is connected to each of the plurality of second electrode films 61b. The plurality of second contact electrodes 31b extend along the Z-axis.

The second contact electrode 31b penetrates the liner film 19 to be connected to each of the plurality of second electrode films 61b (the second coupled electrode films 61B). The second contact electrode 31b is buried in the second contact part insulating layer 70b.

The second contact electrode 31b connects each of the plurality of second electrode films 61b to each of a plurality of word lines 33. At least a part of the word lines 33 can be set to be the same layer as the source line SL.

According to such configuration, also in the second contact part CU2, thermal contraction is reduced, a film stress is suppressed, and warpage of the wafer (the substrate 11), etc. are reduced while a high burying property is obtained. As a result of this, stable performance and high productivity can be achieved.

A thickness of a concave portion (for example, a groove) in which the second contact part insulating layer 70b is buried is the same as the thickness T1. A width w5 (for example, a width along the X-axis) of an opening of the concave portion in which the second contact part insulating layer 70b is buried is substantially the same as the width w1.

The concave portion in which the second contact part insulating layer 70b is buried is also enlarged toward the opening. As shown in FIG. 5, a width w7 of a portion far from the substrate 11 is larger than a width w6 of a portion near the substrate 11. As a result of this, a void etc. is not easily generated in the concave portion.

Figure 6:
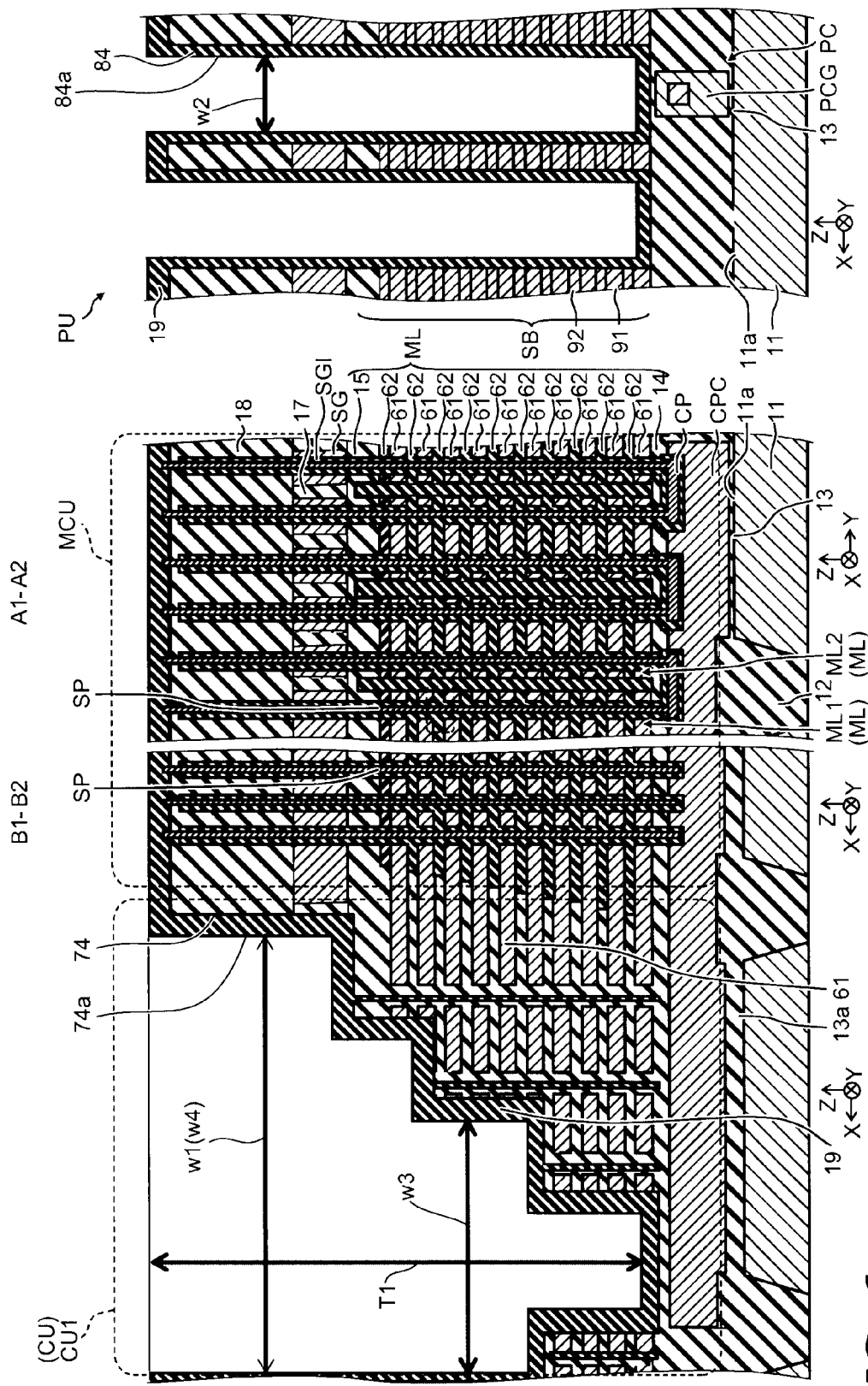
FIG. 6 is a process order schematic cross-sectional view illustrating a method for manufacturing the nonvolatile semiconductor memory device according to the embodiment.
Figure 7:
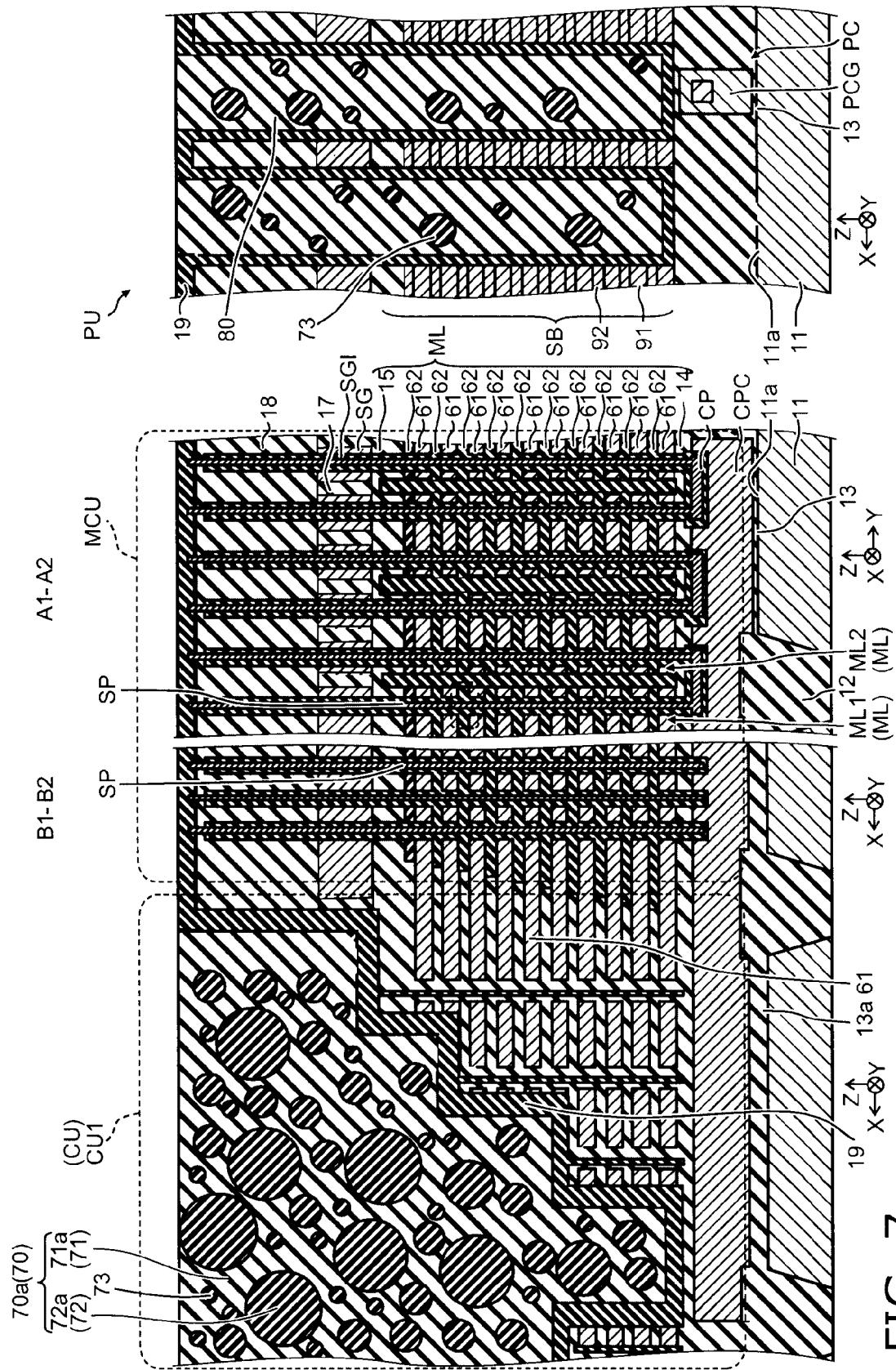
FIG. 7 is a process order schematic cross-sectional view illustrating a method for manufacturing the nonvolatile semiconductor memory device according to the embodiment.

FIGS. 6 and 7 are process order schematic cross-sectional views illustrating a method for manufacturing the nonvolatile semiconductor memory device according to the embodiment.

As shown in FIG. 6, the stacked body ML, the semiconductor layer SP, the select gate electrode SG, and various types of interlayer insulating films are formed. Ends of the plurality of electrode films 61 are processed stepwise in the contact part CU. As a result of this, a concave portion 74 in which the contact part insulating layer 70 is buried later is formed.

In the peripheral circuit part PU, a concave portion 84 in which the peripheral circuit part insulating layer 80 is buried later is formed. Formation of the concave portion 84 can be performed, for example, at the same time of at least a part of formation of the concave portion 74.

Subsequently, the liner film 19 is formed so as to cover the whole processed body.

A width of the concave portion 74 after the liner film 19 is formed is decreased only by twice a thickness of the liner film. Hereinafter, the concave portion 74 after the liner film 19 is formed is set as a concave portion 74*a*.

The width of the concave portion 74 after the liner film 19 is formed is decreased only by twice the thickness of the liner film. Hereinafter, the concave portion 84 after the liner film 19 is formed is set as a concave portion 84*a*.

In the first contact part CU1 the thickness T1 (the thickness along the Z-axis) of the concave portion 74*a* in which the contact part insulating layer 70 is buried is, for example, approximately 1.5 μm to 3 μm.

Additionally, the width w3 of the portion near the substrate 11 of the concave portion 74*a* is smaller than the width w4 of the portion far from the substrate 11 of the concave portion 74*a*. That is, the concave portion 74*a* is enlarged toward the opening.

As shown in FIG. 7, the contact part insulating film 71 (the first contact part insulating film 71*a*) and the particle 72 (the first particle 72*a*) are buried in the concave portion 74*a*. The diameter of the particle 72 is, for example, not less than 300 nm. At this time, the fine particle 73 having a diameter less than 300 nm may be buried. As a result of this, the contact part insulating layer 70 is formed. A coating method, for example, is used for burying the contact part insulating film 71 and the particle 72.

A material of the contact part insulating film 71 is buried in the concave portion 84*a*. That is, the peripheral circuit part insulating layer 80 contains the same material as used for the contact part insulating film 71. At this time, the fine particle 73 having a diameter less than 300 nm may be buried. As a result of this, the peripheral circuit part insulating layer 80 is formed.

Formation of the peripheral circuit part insulating layer 80 can be performed at the same time of forming the contact part insulating layer 70.

Additionally, the liner film 19 is planarized as a stopper, for example, by CMP.

Further, the contact electrode 31 is formed in the contact part insulating layer 70. Meanwhile, the peripheral circuit part contact electrode 81 is formed in the peripheral circuit part insulating layer 80.

After that, various types of interconnects and various types of interlayer insulating films are formed, and then the nonvolatile semiconductor memory device 110 is completed.

According to the manufacturing method, an insulating material can be buried with a high burying property in the concave portion 74 (or the concave portion 74*a*) and the concave portion 84 (or the concave portion 84*a*). Additionally, thermal contraction is reduced, a film stress is suppressed, and warpage of the wafer (the substrate 11), etc. can be reduced by burying the particle 72 with the large diameter in the concave portion 74 (or the concave portion 74*a*). As a result of this, nonvolatile semiconductor memory devices having stable performance and high productivity can be manufactured with high productivity.

According to the embodiment, warpage and damage of the wafer due to a film stress of a material to be buried can be suppressed by using a material containing the particle 72 when an insulating material is buried in the wide concave portion (for example, the concave portion 74 or the concave portion 74*a*). Additionally, a total thickness of a formed film can be suppressed.

Additionally, a narrow concave portion (for example, the concave portion 84 or the concave portion 84*a* in the peripheral circuit part PU) is buried with a material substantially not including the particle 72 with the large diameter. As a result of this, generation of a void is suppressed.

In the embodiment, it is desirable that an etching rate of the particle 72 (the first particle 72*a* and the second particle 72*b*) is close to an etching rate of the contact part insulating film 71 (the first contact part insulating film 71*a* and the second contact part insulating film 71*b*). As a result of this, when a hole for forming the contact electrode 31 is formed in the contact part insulating layer 70, the particle 72 and the contact part insulating film 71 are etched to the same degree, and controllability of a shape of the hole is increased.

For example, it is desirable that the particle 72 (the first particle 72*a* and the second particle 72*b*) contains, for example, an element contained in the contact part insulating film 71 (the first contact part insulating film 71*a* and the second contact part insulating film 71*b*). For example, it is desirable that the particle 72 (the first particle 72*a* and the second particle 72*b*) contains, for example, a compound contained in the contact part insulating film 71 (the first contact part insulating film 71*a* and the second contact part insulating film 71*b*).

For example, when a material containing silicon oxide as a basic constituent is used for the contact part insulating film 71, it is desirable that the material containing silicon oxide as the basic constituent is used for the particle 72. When silicon oxide is used for the contact part insulating film 71, it is desirable that silicon oxide is used for the particle 72.

Figure 8:
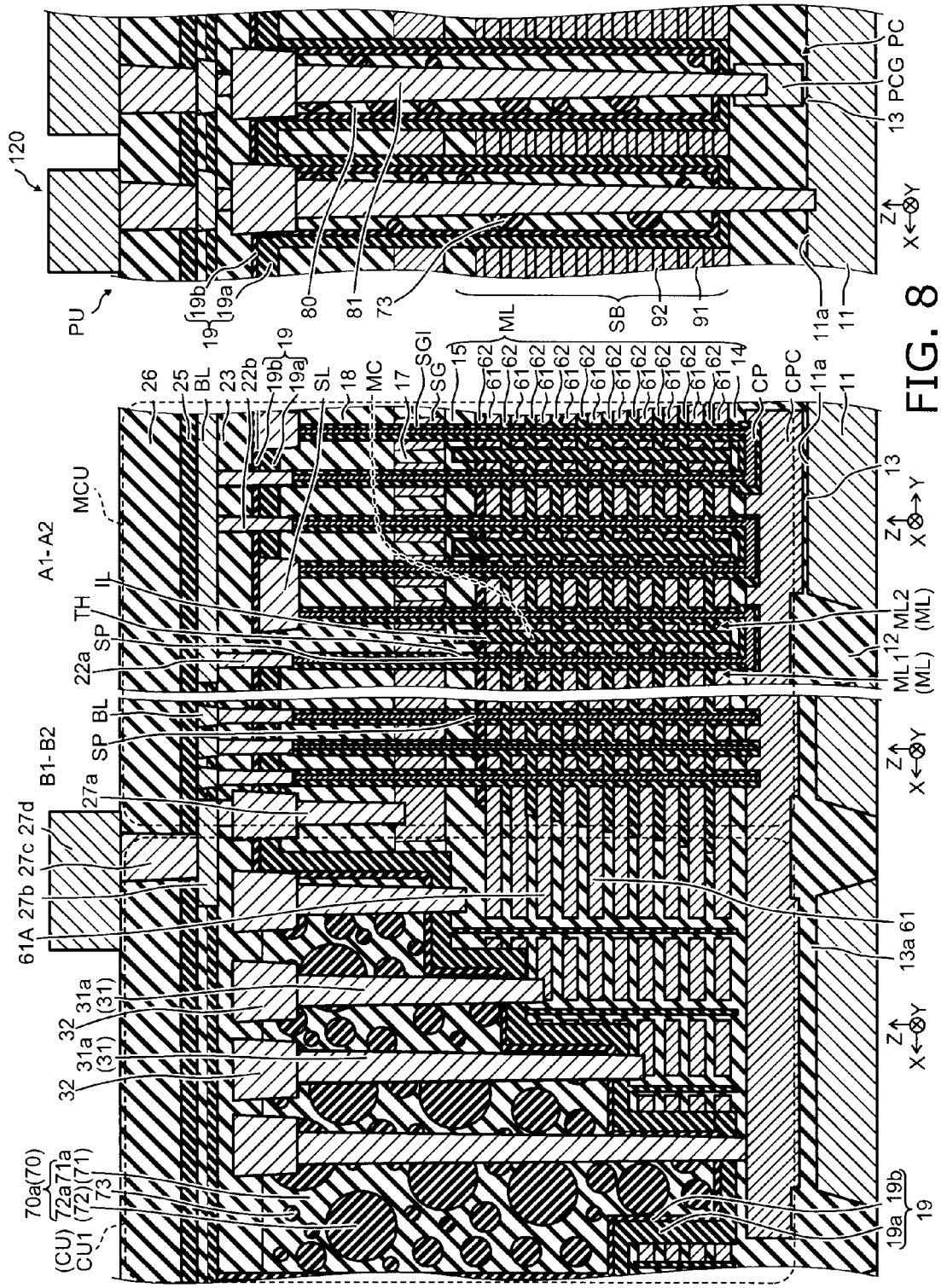
FIG. 8 is a schematic cross-sectional view illustrating a configuration of another nonvolatile semiconductor memory device according to the embodiment.

FIG. 8 is a schematic cross-sectional view illustrating a configuration of another nonvolatile semiconductor memory device according to the embodiment.

As shown in FIG. 8, the liner film 19 has a stacked film configuration in another nonvolatile semiconductor memory device 120 according to the embodiment. That is, the liner film 19 has a first liner film 19*a*, and a second liner film 19*b* stacked on the first liner film 19*a*.

Silicon nitride, for example, can be used for the first liner film 19*a*. Silicon nitride or silicon oxide, for example, can be used for the second liner film 19*b*.

The first liner film 19*a* has, for example, a same thickness as the liner film 19 in the nonvolatile semiconductor memory device 110.

A width of a concave portion (for example, the concave portion 84*a*) can be made small by providing the second liner film 19*b*.

As a result of this, for example, the particle 72 can be suppressed from entering an opening of the concave portion 84*a* in the peripheral circuit part PU. As a result of this, the concave portion 84*a* is suppressed from being blocked in the middle of the concave portion 84*a*.

The embodiment can include a method for manufacturing a nonvolatile semiconductor memory device.

This method is, for example, the method for manufacturing the nonvolatile semiconductor memory device having the configuration of the nonvolatile semiconductor memory device 110 described in regard to FIGS. 1 to 4.

Figure 9:
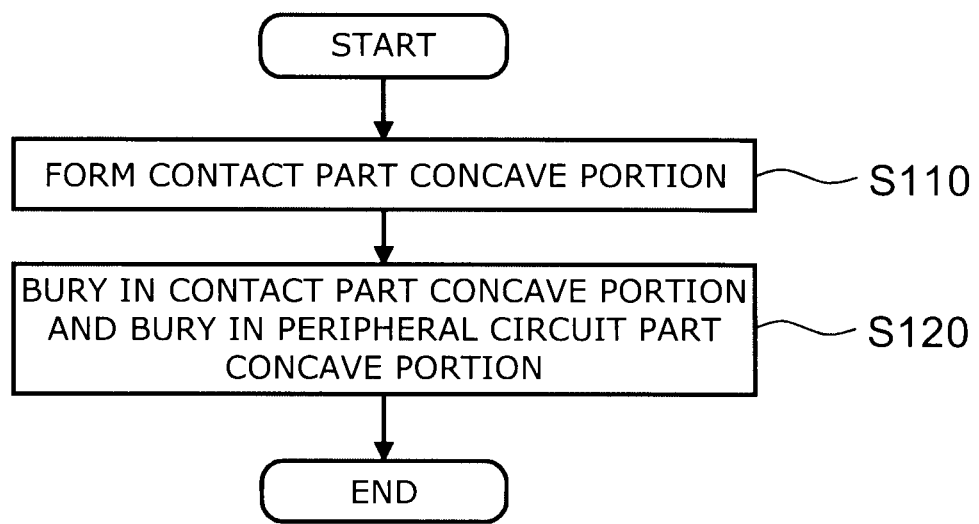
FIG. 9 is a flow chart illustrating the method for manufacturing the nonvolatile semiconductor memory device according to the embodiment.

FIG. 9 is a flow chart illustrating the method for manufacturing the nonvolatile semiconductor memory device according to the embodiment.

As shown in FIG. 9, the manufacturing method includes a process for forming on the substrate 11a first contact part concave portion (for example, the concave portion 74 or the concave portion 74a) in which the first contact part insulating layer 71a is buried, the first contact part concave portion having a width narrower than a width perpendicular to the first axis of the peripheral circuit part concave portion (for example, the concave portion 84 or the concave portion 84a) in which the peripheral circuit part insulating layer 80 is buried (step S110).

The manufacturing method further includes a process for burying the same material as used for the first contact part insulating film 71a in the peripheral circuit part concave portion (for example, the concave portion 84 or the concave portion 84a) while burying the first contact part insulating film 71a and the first particle 72a in the first contact part concave portion (for example, the concave portion 74 or the concave portion 74a) (step S120).

As described above, according to the manufacturing method according to the embodiment, when an insulating material is buried in different patterns of the wide concave portion (for example, the concave portion 74 or the concave portion 74a of the contact part CU) and the narrow concave portion (for example, the concave portion 84 or the concave portion 84a of the peripheral circuit part PU), the wide concave portion is buried with a material in which the particle 72 with the large diameter and a coating film are mixed. Additionally, the narrow concave portion is buried with a material of the coating film not including the particle 72 with the large diameter. As a result of this, the insulating material can be simultaneously buried in the concave portions having different widths without generating a void. In addition, a thickness of a formed film can also be suppressed.

For example, a width along an axis perpendicular to the Z-axis of the first contact part concave portion (for example, the concave portion 74 or the concave portion 74a) is enlarged with increasing distance from the substrate. A width along an axis perpendicular to the Z-axis of the peripheral circuit part concave portion (for example, the concave portion 84 or the concave portion 84a) is smaller than 300 nm.

According to the embodiment, provided are a nonvolatile semiconductor memory device and a method for manufacturing the same that achieve stable performance and high productivity.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nonvolatile semiconductor memory devices such as memory cell array parts, contact parts, peripheral circuit parts, stacked bodies, electrode films, inter-electrode insulating films, semiconductor layers, memory films, charge holding films, contact part insulating layers, contact part insulating films, particles, contact electrodes, peripheral circuits, substrates, interconnects, etc. from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory devices and the methods for manufacturing the same described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a memory cell array part;
   a first contact part arranged with the memory cell array part in a first plane;
   a peripheral circuit part arranged with the memory cell array part in the first plane; and
   a peripheral circuit,
   the memory cell array part including:
      a first stacked body including a plurality of first electrode films stacked along a first axis perpendicular to the first plane, and a first inter-electrode insulating film provided between the two first electrode films being adjacent along the first axis;
      a first semiconductor layer opposed to side faces of the plurality of first electrode films; and
      a memory film provided between the plurality of first electrode films and the first semiconductor layer, and
   the first contact part including:
      a first contact part insulating layer including a first contact part insulating film and a first particle dispersed in the first contact part insulating film; and
      a plurality of first contact electrodes penetrating the first contact part insulating layer along the first axis, each of the plurality of first contact electrodes being connected to each of the plurality of first electrode films, and
   the peripheral circuit part including:
      a structure body;
      a peripheral circuit part insulating layer buried in the structure body and extending along the first axis; and a peripheral circuit part contact electrode penetrating the peripheral circuit part insulating layer along the first axis, and electrically connected to the peripheral circuit, and a width along an axis perpendicular to the first axis of the peripheral circuit part insulating layer being smaller than a diameter of the first particle.

2. The device according to claim 1, further comprising a substrate, the memory cell array part and the first contact part being provided on a major surface of the substrate, and a width along the axis perpendicular to the first axis of the first contact part insulating layer being enlarged with increasing distance from the substrate.

3. The device according to claim 1, wherein the width along the axis perpendicular to the first axis of the peripheral circuit part insulating layer being smaller than 300 nanometers.

4. The device according to claim 1, further comprising a second contact part arranged with the memory cell array part in the first plane, the memory cell array part further including:
a second stacked body including a plurality of second electrode films arranged with the first stacked body along a second axis perpendicular to the first axis, and stacked along the first axis, and a second inter-electrode insulating film provided between the two second electrode films being adjacent along the first axis; and a second semiconductor layer opposed to side faces of the plurality of second electrode films, and the memory film extending between the plurality of second electrode films and the second semiconductor layer, and the second contact part including:
a second contact part insulating layer including a second contact part insulating film and a second particle dispersed in the second contact part insulating film, the second particle having a diameter not less than 300 nanometers; and a plurality of second contact electrodes penetrating the second contact part insulating layer along the first axis, each of the plurality of second contact electrodes being connected to each of the plurality of second electrode films.

5. The device according to claim 1, wherein the peripheral circuit part insulating layer includes a same material as used for the first contact part insulating film.

6. The device according to claim 1, wherein the first particle contains a compound contained in the first contact part insulating film.

7. The device according to claim 1, wherein the first particle contains an element contained in the first contact part insulating film.

8. The device according to claim 1, wherein the first contact part insulating film and the first particle contain silicon oxide.

9. The device according to claim 1, wherein the first contact part insulating film includes a film of a coating type material.

10. The device according to claim 1, wherein a diameter of the first particle is not less than 300 nanometers.

11. The device according to claim 1, wherein the contact part insulating layer contains a particle having a diameter not less than 300 nanometers, and a fine particle having a diameter less than 300 nanometers.

12. The device according to claim 1, wherein plural first particle are provided, and a ratio of content of particles having a diameter not less than 300 nanometers contained in the peripheral circuit part insulating layer is lower than a ratio of content of the first particles having a diameter not less than 300 nanometers contained in the first contact part insulating layer.

13. The device according to claim 1, wherein
the first semiconductor layer penetrates the first stacked body along the first axis, and
the memory film is provided around a side face along the first axis of the first semiconductor layer between the plurality of first electrode films and the first semiconductor layer.

14. The device according to claim 13, wherein
the memory film includes:
a charge holding film provided between the first semiconductor layer and the plurality of first electrode films;
an inner insulating film provided between the first semiconductor layer and the charge holding film; and
an outer insulating film provided between the charge holding film and the plurality of first electrode films.

15. The device according to claim 1, further comprising a substrate,
the memory cell array part, the first contact part and the peripheral circuit part being provided on a major surface of the substrate, and
the peripheral circuit being provided between and the structure body and the substrate.

* * * * *